(12) United States Patent
Lu (10) Patent No.: US 7,378,776 B2
(45) Date of Patent: May 27, 2008

(54) PIEZOELECTRIC CERAMIC COMPOSITION AND PIEZOELECTRIC ELEMENTS USING THE SAME

(75) Inventor: Yao Tsun Lu, Taoyuan (TW)

(73) Assignee: Ariose Electronics Co. Ltd., Taoyuan (TW)

( * ) Notice: Subject to any disclaimer, the term of this patent is extended or adjusted under 35 U.S.C. 154(b) by 345 days.

(21) Appl. No.: 11/220,083

(22) Filed: Sep. 6, 2005

(65) Prior Publication Data
US 2007/0052328 A1  Mar. 8, 2007

(51) Int. Cl.
*H04R 17/00* (2006.01)
(52) U.S. Cl. ............... 310/322; 381/114; 381/190; 310/363; 310/364; 310/365; 310/366
(58) Field of Classification Search ........... 310/322, 310/328, 363–366; 381/114, 190
See application file for complete search history.

(56) References Cited

U.S. PATENT DOCUMENTS 7,061,166 B2 * 6/2006 Kuniyasu .................... 310/365
7,199,509 B2 * 4/2007 Kuniyasu et al. ........... 310/365
2004/0251784 A1 * 12/2004 Kuniyasu .................... 310/328

FOREIGN PATENT DOCUMENTS

| EP | 1501074 A2 * | 1/2005 |
|---|---|---|
| JP | 03141677 A * | 6/1991 |
| JP | 07094796 A * | 4/1995 |
| WO | WO 03094252 A2 * | 11/2003 |
| WO | WO 2005069383 A1 * | 7/2005 |

OTHER PUBLICATIONS

EPO search report for Application EP 05020017—filed by the Applicants Jan. 17, 2008.*

* cited by examiner

*Primary Examiner*—Jaydi A San Martin (57) ABSTRACT

A piezoelectric ceramic composition includes a top-layer, a bottom-layer and at least one intermediate-layer ceramic sheets stacked to each other for sintering. An alloy layer of silver and palladium is interposed between every two ceramic sheets, and a sliver layer is coated on each exposed surface of the top-layer and the bottom-layer ceramic sheets, so as to form a positive and a negative electrode circuit therein. The piezoelectric ceramic composition with the silver layer is attached to at least one surface of a metal plate to make a piezoelectric element which is used to make a piezoelectric actuator, loudspeaker or buzzer.

6 Claims, 9 Drawing Sheets

PIEZOELECTRIC CERAMIC COMPOSITION AND PIEZOELECTRIC ELEMENTS USING THE SAME

BACKGROUND OF THE INVENTION

1. Field of Invention

The present invention relates to a piezoelectric ceramic composition and piezoelectric elements, and more particular, to a piezoelectric element composed of plural ceramic layers to form a positive and a negative electrode conductive circuits and a piezoelectric actuator, loudspeaker or buzzer using the piezoelectric element.

2. Related Art

The piezoelectric actuator, loudspeaker or buzzer typically uses a piezoelectric element to be stimulated by driving signals received from positive and negative electrodes to produce sound.

The conventional piezoelectric element includes a ceramic sheet of single layer attached on one surface of a metal plate. Each ceramic sheet has exposed surface coated with a conductive material as an electrode layer for a conducting line from a positive electrode of a signal provider to be soldered thereon. A negative electrode of the signal provider is soldered on the metal board. As such, the driving signals can be transmitted from outside to stimulate the piezoelectric element to resonate and the piezoelectric element can be used for the piezoelectric actuator, loudspeaker or buzzer to produce sound.

However, due to single layer of ceramic sheet is attached on the metal plate; therefore, higher driving voltage is required to obtain better output sound. If the signal provider inputs lower voltage signal, it is hard to obtain good resonant sound between the single ceramic sheet and the metal plate. This is an issue needed to be overcome.

SUMMARY OF THE INVENTION

In the first aspect, the present invention is to provide a piezoelectric ceramic composition with lower driving voltage.

Accordingly, the piezoelectric ceramic composition of the present invention includes a top-layer, a bottom-layer and at least one intermediate-layer ceramic sheets stacked to each other to be processed in an equalized pressure by hot water for sintering at high temperature thereafter.

An alloy layer of silver (Ag) and palladium (Pb) is interposed between every two ceramic sheets to be as a positive or a negative conductive electrode. The alloy layer includes a predetermined proportion of silver. Silver has excellent conductivity but has a melting point only of 961° C.; however, Pb has both good conductivity and higher melting point of 1554° C. Therefore, the alloy layer of Ag and Pb can endure the high-temperature sintering at 1150° C. to complete the piezoelectric ceramic composition.

A positive and a negative electrode via holes are formed through the ceramic layers and the alloy layers, respectively. A silver layer is then coated on the exposed surface of each top-layer and bottom-layer ceramic sheet to fill in the corresponding positive or negative electrode via hole. Moreover, each alloy layer and silver layer are formed with an insulating aperture surrounding corresponding positive or negative electrode via hole so as to construct a positive and a negative electrode circuits in the piezoelectric ceramic composition to connect a voltage signal. The driving voltage is reduced because of plural insulating ceramic sheets cooperated with plural conducting alloy layers and silver layers to form the conductive circuit.

In the second aspect, the present invention is to provide a piezoelectric actuator using the above-mentioned piezoelectric ceramic composition. The piezoelectric actuator is easy for mass productions, which can be driven to produce sound at lower voltage without messy extending conductive lines. Accordingly, at least one piezoelectric ceramic composition with a bottom silver layer attached to a metal plate makes a piezoelectric element. The piezoelectric element combines an insulating bracket including a positive and a negative electrode conductive parts to form the piezoelectric actuator.

In the third aspect, the present invention provides a piezoelectric loudspeaker using the above-mentioned piezoelectric ceramic composition. Similarly, the piezoelectric loudspeaker is easy for mass productions, which can be driven to produce sound at lower voltage without messy extending conductive lines. Accordingly, a damping pad is provided to adhere the piezoelectric element on an insulating base with a driving circuit dice mounted inside to make the piezoelectric loudspeaker.

In the forth aspect, the present invention provides a piezoelectric buzzer using the above-mentioned piezoelectric ceramic composition, which is easy for mass productions. Accordingly, the piezoelectric element is mounted in clamping slot of a housing by silicon glue to make the piezoelectric buzzer. Or the piezoelectric element is mounted on an annular support formed in the housing by the silicon glue to make the piezoelectric buzzer.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

Figure 1:
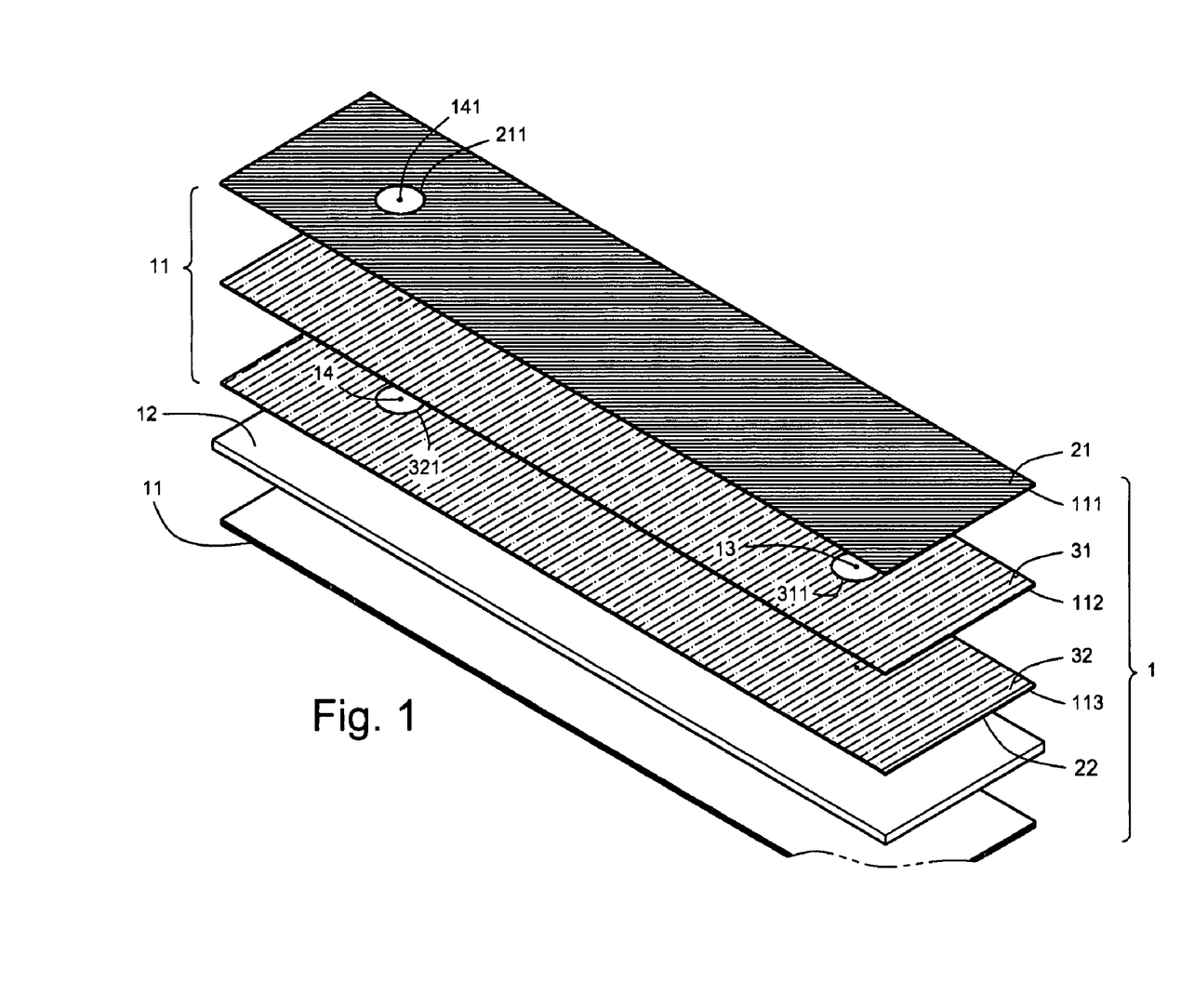
FIG. 1 is an exploded perspective view of a piezoelectric element according to the present invention.

Referring to FIG. 1, a piezoelectric ceramic composition 11 and a piezoelectric element 1 are illustrated. The piezoelectric ceramic composition 11 includes a top-layer ceramic sheet 111, a bottom-layer ceramic sheet 113 and at least one intermediate-layer ceramic sheet 112. These rectangular ceramic sheets 111, 112 and 113 are stacked to each other and will be processed in an equalized pressure by hot water for sintering at high temperature thereafter.

Figure 2:
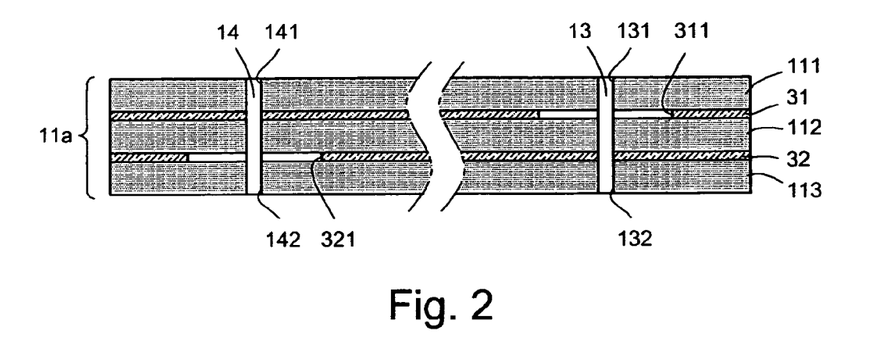
FIG. 2 is a cross section view of a semimanufacture of a piezoelectric ceramic composition.

A first alloy layer 31 is interposed between the top-layer and the intermediate-layer ceramic sheets 111 and 112, and a second alloy layer 32 is interposed between the intermediate-layer and the bottom-layer and ceramic sheets 112 and 113. The first and the second alloy layers 31 and 32 are composed of silver (Ag) and palladium (Pd) to tightly combine all the ceramic sheets to form the piezoelectric ceramic composition 11 after sintering, as shown in FIG. 2. Therefore, the first and the second alloy layers 31 and 32 are insulated by the intermediate-layer ceramic sheet 113.

At least one insulating aperture is formed on each alloy layer. In the preferred embodiment, a first insulating aperture 311 is formed on the first alloy layer 31, and a second insulating aperture 321 is formed on the second alloy layer 32. Moreover, a positive electrode via hole 13 and a negative electrode via hole 14 are formed to pass through all the ceramic sheets and a corresponding alloy layer.

The positive electrode via hole 13 includes a positive electrode top hole 131 formed on the top-layer ceramic sheet 111, which sequentially connects the top-layer ceramic sheet 111, the intermediate-layer sheet 112, the second alloy layer 32 and the bottom-layer ceramic sheet 113 but passes within the first insulating aperture 311 of the first alloy layer 31. Similarly, the negative electrode via hole 14 includes a negative electrode top hole 141 formed on the top-layer ceramic sheet 111, which sequentially connects the top-layer ceramic sheet 111, the intermediate-layer sheet 112, the first alloy layer 31 and the bottom-layer ceramic sheet 113 but passes within the second insulating aperture 321 of the second alloy layer 32.

Figure 3:
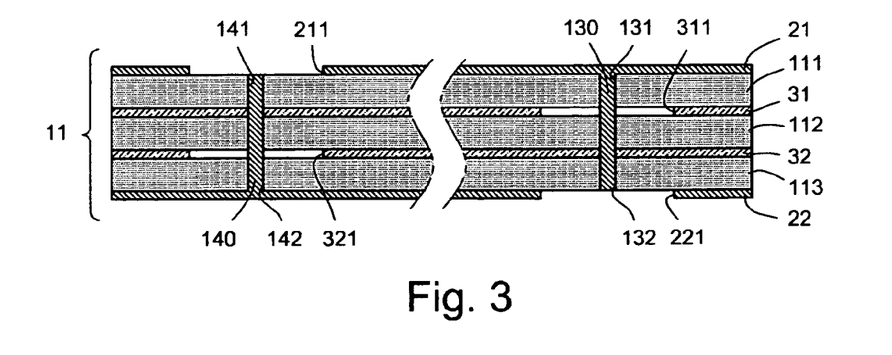
FIG. 3 is a cross section view of the piezoelectric ceramic composition.

Referring to FIG. 3, after a semimanufacture 11a of the piezoelectric ceramic composition 11 is completed, a top silver layer 21 and a bottom silver layer 22 are coated on the surfaces of the top-layer and the bottom-layer ceramic sheets 111 and 113 and filled in the positive and the negative electrode via holes 13 and 14, respectively. Moreover, a top insulating aperture 211 is formed on the top silver layer 21 enclosing the negative electrode top hole 141 to insulate the top silver layer 21 from the silver filled in the negative electrode via hole 14. Similarly, a bottom insulating aperture 221 is formed on the bottom silver layer 22 enclosing the positive electrode top hole 131 to insulate the bottom silver layer 22 from the silver filled in the positive electrode via hole 13. Therefore, the top silver layer 21 and the second alloy layer 32 are connected by the silver filled in the positive electrode via hole 13 to form a positive electrode circuit 130, and the bottom silver layer 22 and the first alloy layer 31 are connected by the silver filled in the negative electrode via hole 14 to form a negative electrode circuit 140. Such that, the piezoelectric ceramic composition 11 is completed to have the top silver layer 21 as the contact terminal of the positive electrode circuit 130 and the bottom silver layer 22 as the contact terminal of the negative electrode circuit 140.

Figure 4:
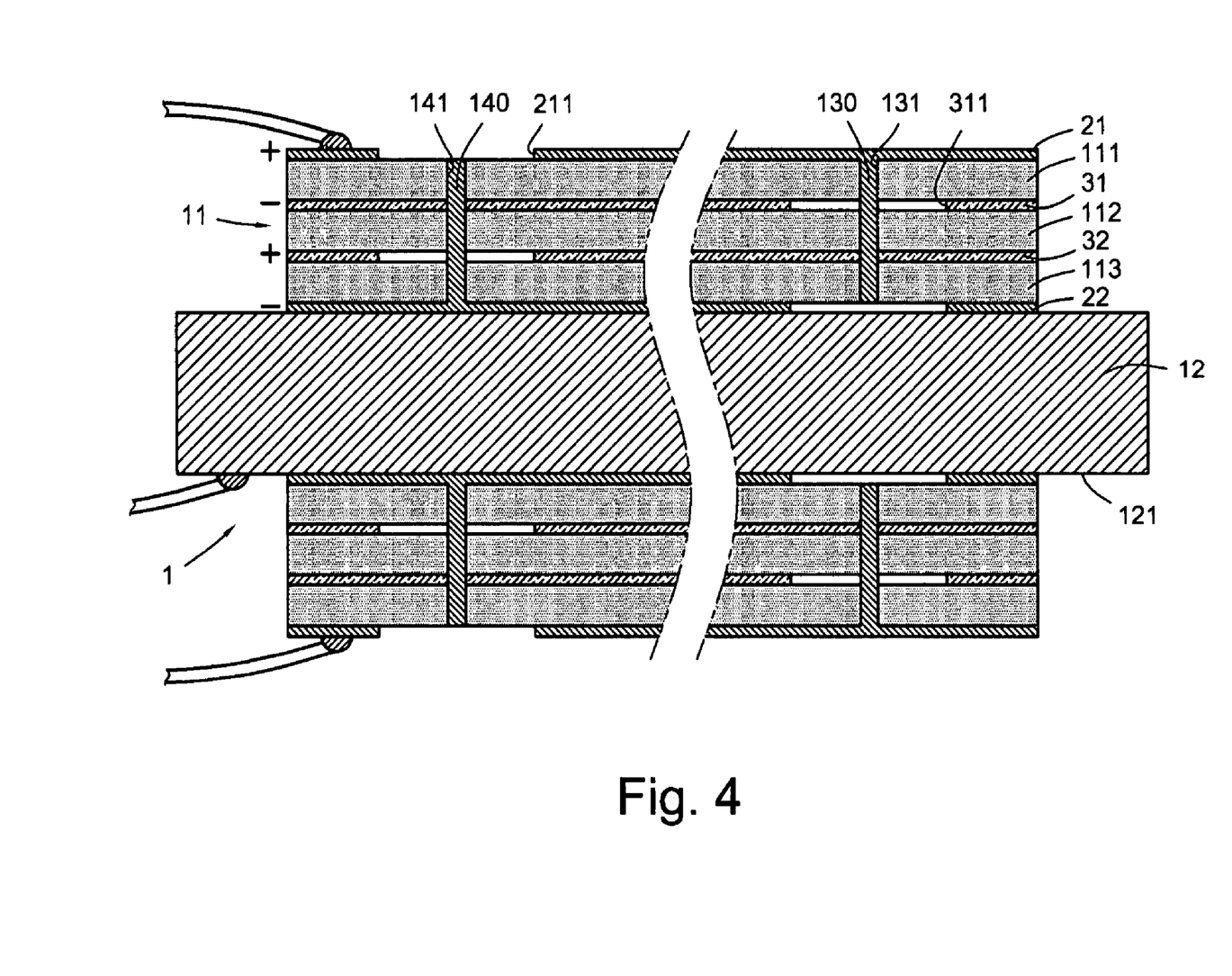
FIG. 4 is a cross section view of the piezoelectric element.

Referring to FIGS. 1 and 4, two piezoelectric ceramic compositions 11 are used to attach on two opposite surfaces of a rectangular metal plate 12, respectively. In the preferred embodiment, the bottom silver layer 22 is contacted with the metal plate 12 to have an exposed end 121 of the metal plate 12 without piezoelectric ceramic composition 11 formed as a negative electrode terminal, and each top silver layer 21 of two piezoelectric compositions 11 as a positive electrode terminal. Such that, the piezoelectric element 1 with the piezoelectric ceramic composition 11 mounted on at least one side is completed.

In using the piezoelectric element 1, a positive electrode signal source is soldered on each top silver layer 21 and a negative electrode signal source is soldered on the exposed end 121. As such, the positive electrode voltage signal is conducted by the top silver layer 21 as well as the second alloy layer 32 via the positive electrode circuit 130, and the negative electrode voltage signal is conducted by the bottom silver layer 22 as well as the first alloy layer 31 via the negative electrode circuit 140. That is, a conductive circuit with alternative positive or negative voltage signal between two adjacent ceramic sheets or between adjacent ceramic sheet and metal plate is formed in the piezoelectric element 1; therefore a driving voltage is reduced to obtain better sound output for the applications.

Figure 5:
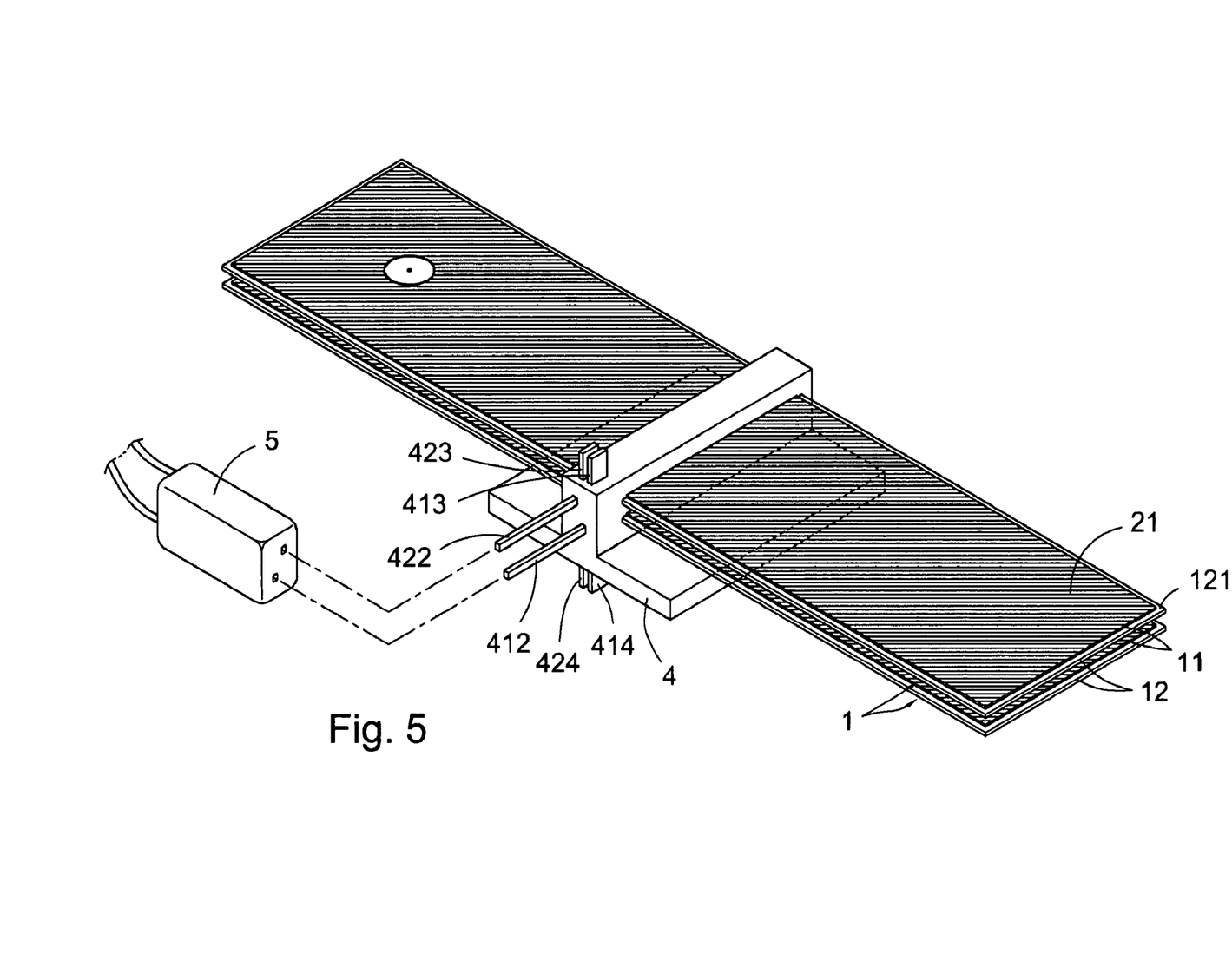
FIG. 5 is a perspective view of a piezoelectric actuator used for a socket.

Referring to FIG. 5, at least one piezoelectric element 1 is used to make a piezoelectric actuator. In the preferred embodiment, two piezoelectric elements 1 are mounted to an insulating bracket 4 which includes a positive and a negative electrode conductive parts 41 and 42 packaged therein.

Figure 6:
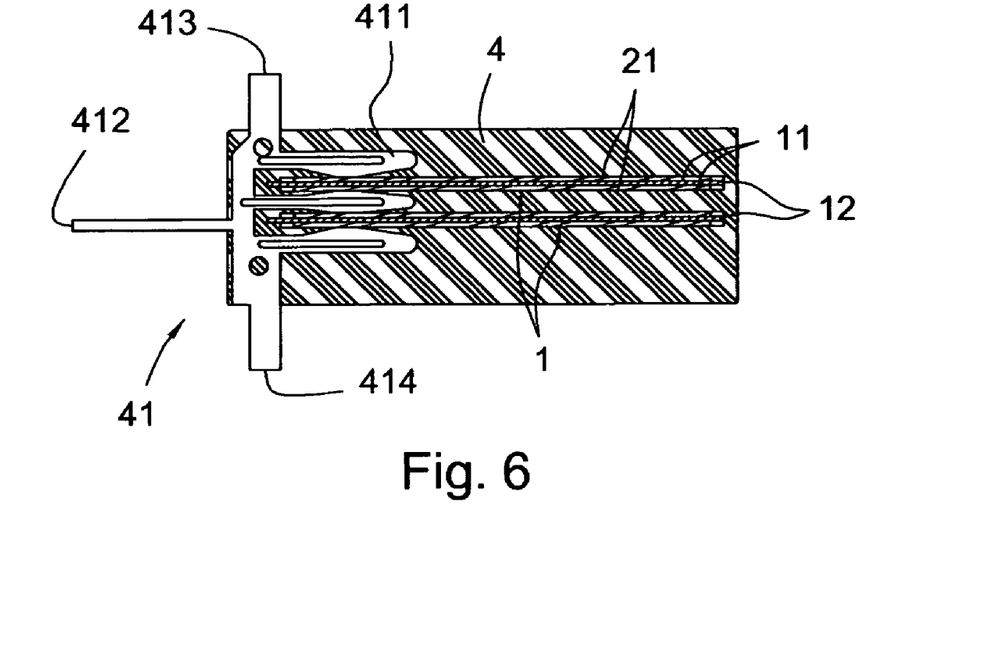
FIG. 6 is a cross section view of the piezoelectric actuator showing a positive electrode conductive part.

As shown in FIG. 6, the positive electrode conductive part 41 includes three contact terminals 411 to clamp two piezoelectric elements 1 therebetween from one end and contact with the top silver layers 21, respectively. The positive electrode conductive part 41 further includes three connecting pins 412, 413 and 414 extending outwardly from the front, the top and the bottom thereof.

Figure 7:
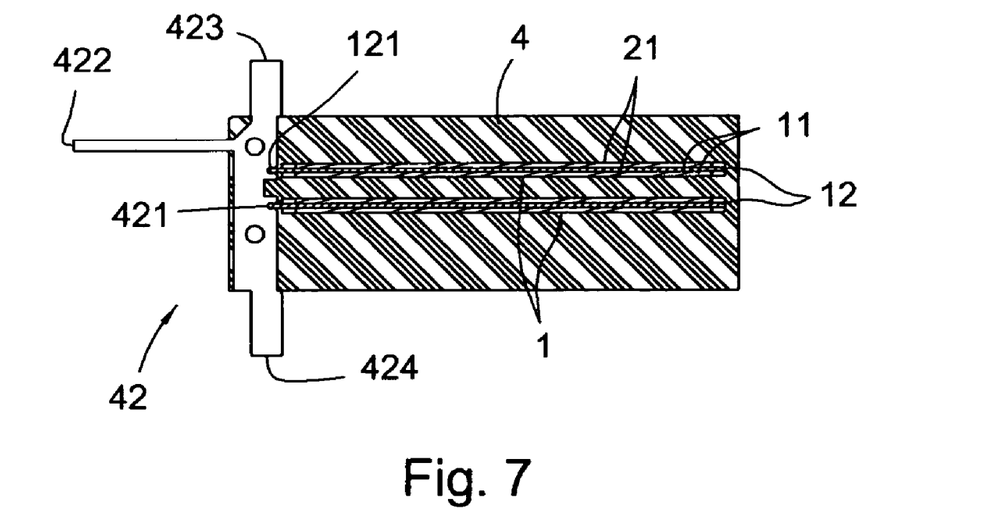
FIG. 7 is a cross section view of the piezoelectric actuator showing a negative electrode conductive part.

As shown in FIG. 7, the negative electrode conductive part 42 includes two clamp openings 421 each to receive the exposed end 121 of the metal plate 12 of the piezoelectric element 1. The negative electrode conductive part 42 also includes three connecting pins 422, 423 and 424 extending outwardly from the front, the top and the bottom thereof.

Figure 8:
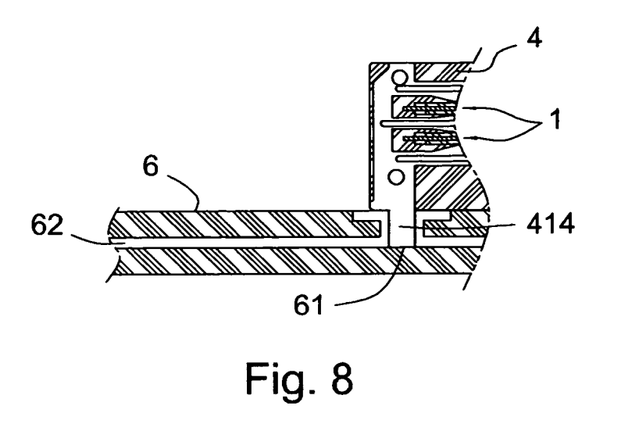
FIG. 8 is a cross section view of the piezoelectric actuator surface-mounted on a substrate.

Accordingly, a connector 5 can be used to connect with the piezoelectric actuator by the connecting pins 412 and 422, as shown in FIG. 5, to receive the voltage signal therefrom. Or, the connecting pins 414 and 424 are directly used to insert in corresponding slots 61 provided in a substrate 6, as shown in FIG. 8, to receive the voltage signal from a circuit 62 of the substrate 6. The input voltage signal will drive the piezoelectric actuator under resonance to produce sound.

Figure 9A:
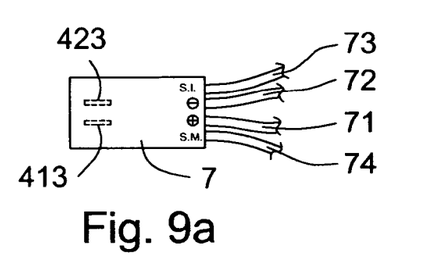
FIGS. 9a and 9b show a driving circuit dice and a cross section view of the driving circuit dice integrated with the piezoelectric actuator.
Figure 9B:
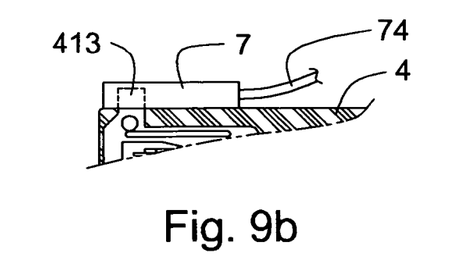

Furthermore, the driving circuit can be made as a dice 7, as shown in FIG. 9a, to be integratedly formed with the piezoelectric actuator, as shown in FIG. 9b.

The driving circuit is an integrated circuit includes a DC converter and an amplifier (AMP). An input port of the dice 7 includes a sound positive electrode (V+) 71, a sound negative electrode (V−) 72, a signal input (SI) 73 and a standby mode (SM) 74. An output port 75 of the dice 7 can be directly mounted to the connecting pins 413 and 423 of the piezoelectric actuator, so as to transmit voltage signal. Moreover, the dice 7 can include a bluetooh module for wireless transmitting sound signal generated by the piezoelectric actuator.

Figure 10:
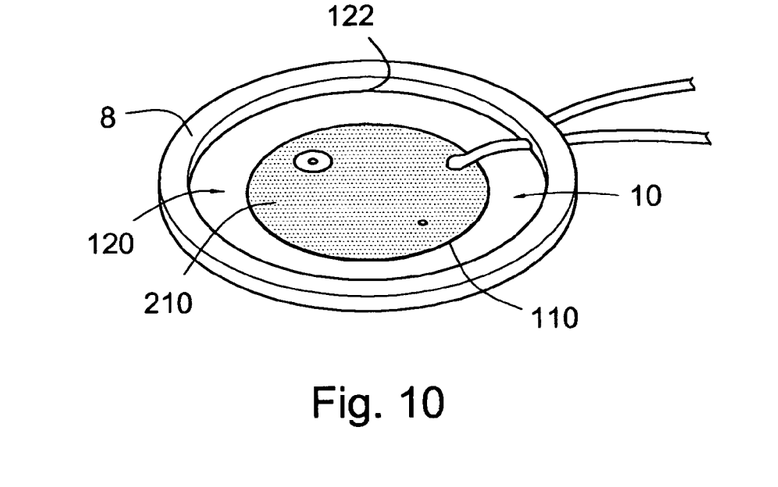
FIG. 10 is a perspective view of a piezoelectric loudspeaker according to one preferred embodiment.

Referring to FIG. 10, at least one circular piezoelectric element 10 is used to make a piezoelectric loudspeaker. The piezoelectric element 10 has the same structure of a piezoelectric ceramic composition 110 and a metal plate 120 as above-mentioned piezoelectric element 1. The metal plate 120 has an exposed boundary portion 122 with a damping pad 8 made of high resistant adhesive attached thereon to improve low-frequency sound quality.

Figure 11:
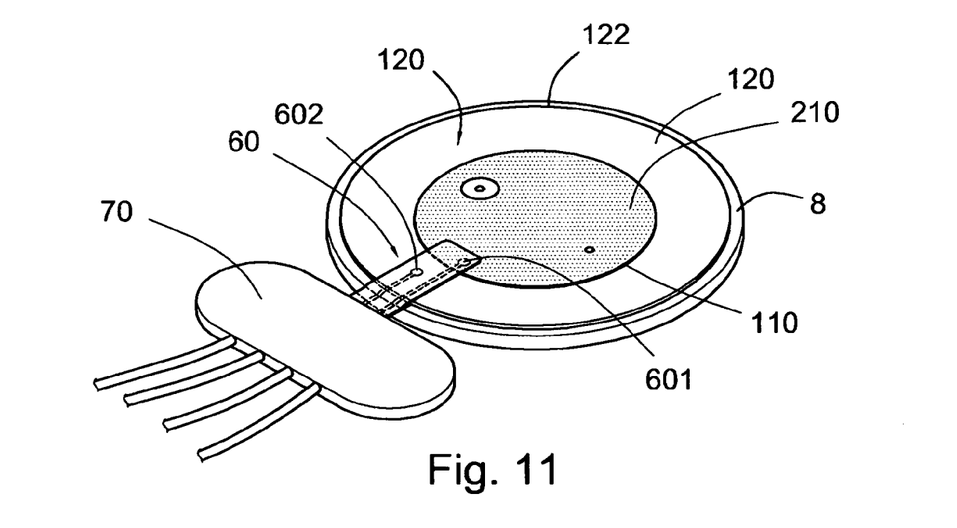
FIG. 11 is a perspective view of a piezoelectric loudspeaker according to another preferred embodiment.

Referring to FIG. 11, which the piezoelectric element 10 is flipped over, the piezoelectric loudspeaker can also be integrated with a driving circuit dice 70 including a sound positive electrode, a sound negative electrode, a signal input and a standby mode as mentioned above. An output port of the dice 70 includes a flexible printed circuit (FPC) 60 with a positive and a negative electrode outputs 601 and 602. The positive electrode output 601 is connected to each top silver layer 210 of the piezoelectric element 110 and the negative electrode output 602 is connected to the meal plate 120. So that the driving circuit dice 70 can be integratedly formed with the piezoelectric loudspeaker.

Figure 12:
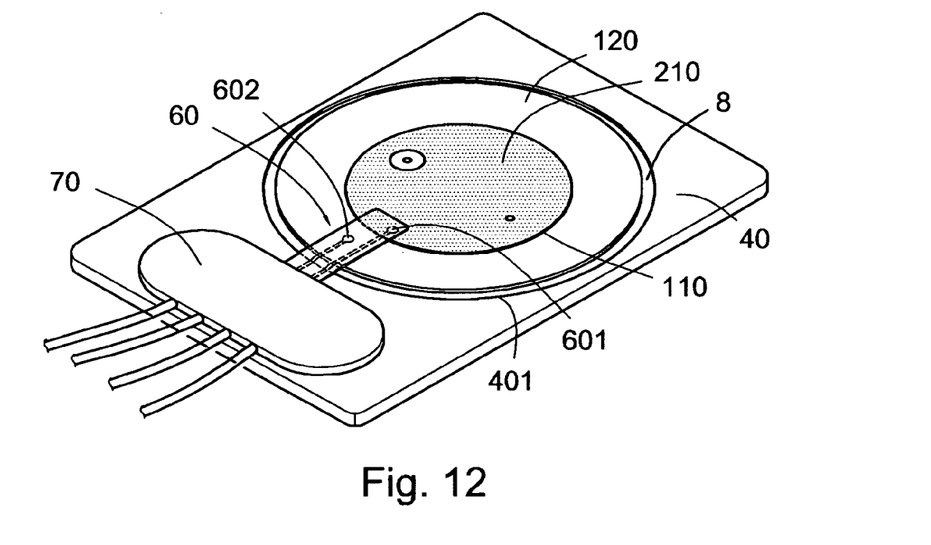
FIG. 12 is a perspective view of a piezoelectric loudspeaker according to still another preferred embodiment.
Figure 13:
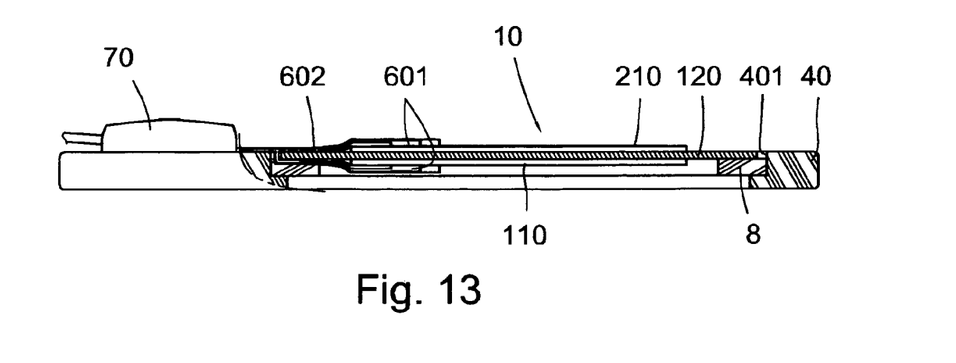
FIG. 13 is a cross section view of FIG. 12.

Alternatively, referring to FIGS. 12 and 13, an insulating base 40 including the driving circuit dice 70 and a recess 401 is provided. The piezoelectric loudspeaker can utilize adhesion of the damping pad 8 to be securely disposed in the recess 401.

Figure 14:
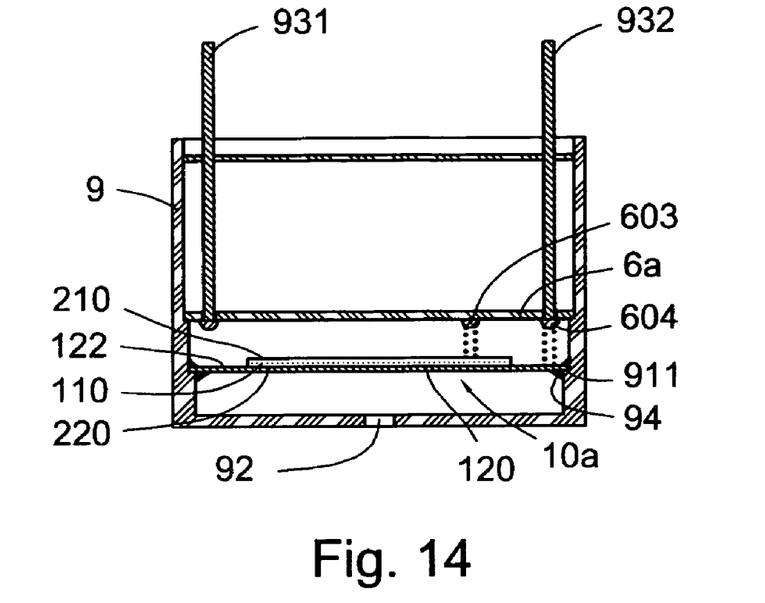
FIG. 14 is a cross section view of a piezoelectric buzzer according to one preferred embodiment.

Furthermore, as shown in FIG. 14, piezoelectric buzzer includes a circular piezoelectric element 10a and a housing 9. The circular piezoelectric element 10a is formed with a bottom silver layer 220 of a circular piezoelectric ceramic composition 110 attached on a circular metal plate 120. The boundary portion 122 of the metal plate 120 is used to be securely fixed on a clamping slot 911 of a housing 9 by silicon glue 94. An orifice 92 is formed on the bottom of the housing 9 to have the sound produced by the piezoelectric element 10a spoken out therethrough. A substrate board 6a is located inside the housing 9 above the piezoelectric element 10a. The substrate board 6a includes a positive electrode output 603 connected to a top silver layer 210 of the piezoelectric ceramic composition 110, and a negative electrode output 604 connected to the boundary portion 122 of the metal plate 120. Moreover, the substrate board 6a includes a positive electrode input 931 and a negative electrode input 932 for receiving source signal to drive the piezoelectric buzzer.

Figure 15:
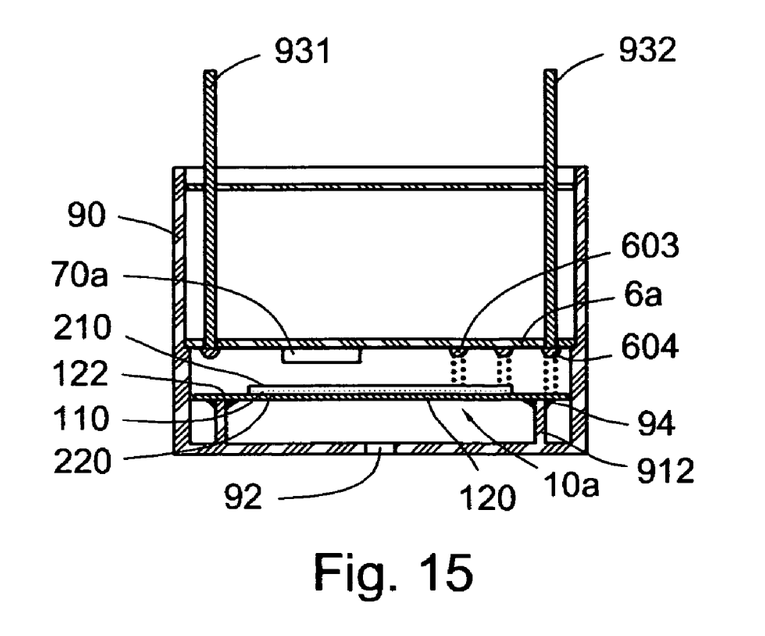
FIG. 15 is a cross section view of a piezoelectric buzzer according to one preferred embodiment.

Referring to FIG. 15, a driving circuit dice 70a with a sound source positive electrode and a sound source negative electrode is disposed on the substrate board 6a and between the positive and the negative electrode outputs 603 and 604 and the positive and negative electrode inputs 931 and 932. The sound source positive electrode of the driving circuit dice 70a is connected with the positive electrode input 931, and the sound source negative electrode of the driving circuit dice 70a is connected with the negative electrode input 932. Moreover, the boundary portion 122 is securely fixed to an annular support 912 by the silicon glue 94 to install the piezoelectric element 10a in the housing 9.

Accordingly, the piezoelectric actuator, loudspeaker and buzzer of the present invention have compact electrode connection without messy extending conductive lines. Also, by using the piezoelectric element made of the piezoelectric ceramic composition with lower driving voltage, the applications of piezoelectric actuator, loudspeaker and buzzer can produce sound under lower driving voltage to stimulate resonation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A piezoelectric actuator comprising at least one piezoelectric element (1) mounted to an insulating bracket (4), the piezoelectric element (1; 10; 10a) comprising at least one piezoelectric ceramic unit (11; 110) attached to a metal plate (12; 120), the piezoelectric ceramic unit comprising:

a top-layer (111), a bottom-layer (113) and an intermediate-layer ceramic sheets (112) stacked to each other;

a first alloy layer (31) of silver and palladium interposed between the top-layer and the intermediate-layer ceramic sheets (111, 112);

a second alloy layer (31) of silver and palladium interposed between the intermediate-layer and the bottom-layer and ceramic sheets (111, 112);

wherein a first insulating aperture (311) is formed on the first alloy layer (31), and a second insulating aperture (321) is formed on the second alloy layer (32), wherein a positive electrode via hole (13) is formed to pass through all ceramic sheets (111, 112, 113) and the second alloy layer (32) but pass within the first insulating aperture (311), and a negative electrode via hole (14) is formed to pass through all ceramic sheets (11, 112, 113) and the first alloy layer (31) but pass within the second insulating aperture (321), a top silver layer (21; 210) coated on an exposed surface of the top-layer ceramic sheet (111) and filled in the positive electrode via hole (13);

a bottom silver layer (22, 220) coated on an exposed surface of the bottom-layer ceramic sheet (113) and filled in the negative electrode via hole (14), wherein a top insulating aperture (211) is formed on the top silver layer (21; 210) to insulate the top silver layer (21; 210) from the silver filled in the negative electrode via hole (14), wherein a bottom insulating aperture (221) is formed on the bottom silver layer (112) to insulate the bottom silver layer (22; 220) from the silver filled in the positive electrode via hole (13), thereby, the top silver layer (21; 210) and the second alloy layer (32) are connected by the silver filled in the positive electrode via hole (13) to form a positive electrode circuit (130), and the bottom silver layer (22, 220) and the first alloy layer (31) are connected by the silver filled in the negative electrode via hole (14) to form a negative electrode circuit (140), the metal plate (12; 120) with the bottom-layer ceramic sheet (113) attached on one surface to connect the negative electrode circuit (140) so that an exposed end (121) can be used as a negative electrode terminal, and the top silver layer (21; 210) can be used as a positive electrode terminal;

the insulating bracket (4) comprising a positive electrode conductive part (41) contacted with the metal plate (12; 120), a negative electrode conductive part (42) contacted with the top silver layer (21) and at least one connecting pin (412, 413, 414, 422, 423, 424) extending from each of the positive and the negative electrode conductive parts (41, 42) to receive voltage signal; and a driving circuit dice (7; 70; 70a) having an output port (75) connected to the connecting pins (412, 413, 414, 422, 423, 424) to be integratedly formed with the insulating bracket (4), and an input port with a sound positive electrode (71), a sound negative electrode (72), a signal input and a standby mode so that voltage signal can be transmitted to the piezoelectric element (1, 10, 10a).

2. The piezoelectric actuator of claim 1, further comprising a damping pad (8), wherein the negative electrode terminal is formed as an exposed boundary portion (112) and the damping pad (8) is adhered on the exposed boundary portion (112).

3. The piezoelectric actuator of claim 2, further comprising an insulating base (40) with a recess (401) for receiving the piezoelectric element adhered therein by the damping pad (8).

4. The piezoelectric actuator of claim 3, wherein at least one piezoelectric element (10a) is mounted in a housing (9), wherein the housing includes a substrate board (6a) with a positive electrode output (603) connected to the top silver layer (210), a negative electrode output (604) connected to the boundary portion (122) and a positive and a negative electrode inputs (931, 932) for receiving source signal.

5. The piezoelectric actuator of claim 4, wherein the boundary portion (122) is securely fixed on a clamping slot (911) of the housing (9).

6. The piezoelectric actuator of claim 4, wherein the boundary portion (122) is securely fixed to an annular support (912) to installed the piezoelectric element (10a) in the housing (9).

* * * * *